(12) United States Patent  (10) Patent No.: US 7,425,276 B2
Fries et al.  (45) Date of Patent: Sep. 16, 2008

(54) METHOD FOR ETCHING MICROCHANNEL NETWORKS WITHIN LIQUID CRYSTAL POLYMER SUBSTRATES

(75) Inventors: David P. Fries, St. Petersburg, FL (US); George Steimle, St. Petersburg, FL (US); Heather Broadbent, St. Petersburg, FL (US)

(73) Assignee: University of South Florida, Tampa, FL (US)

( * ) Notice: Subject to any disclaimer, the term of this patent is extended or adjusted under 35 U.S.C. 154(b) by 135 days.

(21) Appl. No.: 11/160,613

(22) Filed: Jun. 30, 2005

(65) Prior Publication Data

US 2006/0216654 A1 Sep. 28, 2006

Related U.S. Application Data

(60) Provisional application No. 60/521,756, filed on Jun. 30, 2004.

(51) Int. Cl.
*C30B 33/00* (2006.01)
*C23F 1/00* (2006.01)

(52) U.S. Cl. .............................. 216/23; 216/2; 216/41; 430/318

(58) Field of Classification Search ............ 216/2, 216/23, 41; 430/318
See application file for complete search history.

(56) References Cited

U.S. PATENT DOCUMENTS

| 4,997,724 | A | 3/1991 | Suzuki et al. |
| 5,217,571 | A | 6/1993 | Rosenau et al. |
| 6,036,901 | A | 3/2000 | Yumoto |
| 6,403,211 | B1 | 6/2002 | Yang et al. |
| 6,696,163 | B2 | 2/2004 | Yang |
| 6,923,919 | B2 | 8/2005 | Yang et al. |
| 2002/0155280 | A1 | 10/2002 | Yang |
| 2002/0162218 | A1 | 11/2002 | Skorupski et al. |
| 2005/0248418 | A1* | 11/2005 | Govind et al. ............... 331/179 |
| 2007/0085108 | A1* | 4/2007 | White et al. ................. 257/173 |

FOREIGN PATENT DOCUMENTS

| EP | 0832918 A1 | 4/1998 |
| JP | 10168577 | 6/1998 |

(Continued)

OTHER PUBLICATIONS

S. Sarkar et al., RF and mm-SOP Module Platform using LCP and RF MEMS Technologies, date not provided.

(Continued)

*Primary Examiner*—Shamim Ahmed
(74) *Attorney, Agent, or Firm*—Anton J. Hopen; Smith & Hopen, P.A.; Molly L. Sauter

(57) ABSTRACT

The present invention provides for a method for the fabrication of microchannels, and more particularly to the fabrication of microchannels for use in Microelectromechanical (MEMS) devices and MEMS related devices. In accordance with an embodiment of the present invention, microchannels are formed by a microfabrication method utilizing electronic imaging techniques in combination with chemical etching and subsequent metallization. The method of the present invention is effective in producing networks of channels in liquid crystal polymer (LCP) polymeric substrates which are highly defined in terms of their patterns, and thus are able to encompass a wide variety of end uses.

14 Claims, 1 Drawing Sheet

FOREIGN PATENT DOCUMENTS

| | | |
|---|---|---|
| WO | WO 02/06423 A1 | 1/2002 |
| WO | WO 02/100135 A2 | 12/2002 |
| WO | WO 03/022021 A1 | 3/2003 |
| WO | WO 03/077622 A1 | 9/2003 |

OTHER PUBLICATIONS

Stamping "Thin" Circuits Into a Single Sheet, Innovators's Notebook, date not provided.

Xuefeng Wang et al., Micromachining Techniques for Liquid Crystal Polymer, no date provided.

Xuefeng Wang et al., Liquid Crystal Polymer(LCP) for MEMS Applications, Mass Uiuc, no date provided.

Xuefeng Wang et al., Liquid Crystal Polymer (LCP) for MEMS: Processes and Applications, Journal of Micromechanics and Microengineering, 2003, p. 628-633.

* cited by examiner

METHOD FOR ETCHING MICROCHANNEL NETWORKS WITHIN LIQUID CRYSTAL POLYMER SUBSTRATES

CROSS REFERENCE TO RELATED APPLICATIONS

This application claims priority to currently pending U.S. Provisional Patent Application No. 60/521,756, entitled, "Method for Etching Microchannel Networks within Liquid Crystal Polymer Substrates", filed Jun. 30, 2004.

STATEMENT OF GOVERNMENT INTEREST

This invention was made with Government support under Grant No. N00014-98-1-0848 awarded by the Office of Naval Research. The Government has certain rights in the invention.

BACKGROUND OF INVENTION

Channel architectures are almost universally found in complex natural and synthetic systems. Channels existing as waveguides, particle guides, and circuits and are found in both raised and recessed forms. Although channels can be used for theoretical illustrations, such as a channel capacity in an information system, channels are practical solutions for efficiently routing physical particles such as electrons, ions, molecules, protons, etc. from a source to a destination.

Channels that are reduced in size can be classified as microchannels when they range from 1 µm to 1000 µm. Within this micro range, the physical phenomena of mechanical, electrical, optical and fluidic circuitry have variable optical size, performance and cost features. For example, microfluidic circuits below 30 µm used for fluid transport on chips and microreactors, have significant resistance to flow and require more exacting particle filtration while at the same time only yielding moderate dividends in chip real estate. In addition to the increased flow resistance, at sub 30 µm dimensions, there is an increased cost for finer dimensional control. In contrast, electrical circuits yield increased performance with smaller dimensions and warrant the increased cost associated with their manufacture. However, even electrical circuits have applications, for example, in packaging, where channel sizes are micron to millimeter in scale.

Prior art methods of forming microchannel patterns for mechanical, electrical, optical and fluidic circuitry include: embossing, imprinting, soft lithography, inkjet and laser direct writing, and a variety of photolithography techniques. By far the most popular techniques known in the art have employed some form of photolithography to create highly defined, desired microchannel features. However, to date, most of these photolithographic procedures involve multi-step mask and developing steps, thus making processing labor intensive and expensive.

Methods are known in the art for using etchants to treat the surface of a polymer substrate. However, these methods do not teach or suggest the formation of microchannels or channel-like structures that are effective in establishing electrical, optical and fluidic circuitry. Surface preparation methods are known in the art utilizing surface etchants, in low concentrations, as a method of surface roughening to permit subsequent metal lamination in the fabrication process. These methods do not teach or suggest the formation of channels or channel-like structures effective in establishing electrical, optical and fluidic circuitry. Only minimal roughening of the polymer surface utilizing chemical etchants is achieved by the methods previously known in the art.

Additional methods are known in the art utilizing etchants to form through-holes and voids in the substrate for eventual circuit board patterning. These methods do not teach or suggest the use of an etchant system to form complex channels and fluid pathways necessary for the construction of an operational microfluidic device.

The methods known in the art utilizing etchants to produce incidental features in the substrate do not result in the formation of effective grooved patterns and fluid conduits in the substrate that are continuous patterns that can be used in the subsequent formation of microfluidic devices. Although the vias and holes are formed using masking techniques known in the art, these methods do not teach or suggest a method for connecting these features together in a continuous pattern necessary to provide fluid transport.

While various means for the etching of polymer surfaces are known in the art, the current state of the art does not teach or suggest the formation of complex channel structures and other fluidic canals necessary to fabricate microfluidic devices. In contrast, the techniques known the art describe the formation of rough surfaces for further treatment or formation of holes through the polymer substrate. In addition, all of these features are intermediate in nature, and provide little function, and do not contribute to the development of a functional pathway for the fabrication of micofluidic devices.

Accordingly, what is needed in the art is a method for the direct patterning of channels in different photoreactive materials using an electronic mask to create a variety of electrical and photonic circuits, mechanical acoustic waveguides, RF waveguides, and gas or liquid flow channels.

SUMMARY OF INVENTION

The method in accordance with the present invention provides a process for etching of microchannels in a liquid crystal polymer layer of a printed circuit board. The microchannels produced in accordance with this method are effective in the transport of fluids within the printed circuit board polymer layer. In general, the present invention discloses a method for fabricating patterns and networks of microchannels in three-dimensions for transport of fluids or mass and additionally for mass or material containment.

The present invention relates to the field of the creation of microchannels, and more particularly to the fabrication of microchannels for use in Microelectromechanical (MEMS) devices and MEMS related devices. In accordance with an embodiment of the present invention, microchannels are formed by a microfabrication method utilizing electronic imaging techniques in combination with chemical etching and subsequent metallization. The method of the present invention is effective in producing networks of channels in liquid crystal polymer (LCP) polymeric substrates which are highly defined in terms of their patterns, and thus are able to encompass a wide variety of end uses.

In accordance with an embodiment of the present invention is provided a method of forming a patterned microchannel network in a liquid crystal polymer substrate, the method includes the steps of applying a copper layer to a liquid crystal polymer layer to form a copper clad liquid crystal polymer substrate, applying a patterned photoresist to the copper clad liquid crystal polymer substrate, wherein the patterned photoresist defines a desired microchannel network, exposing the patterned photoresist to a light source, developing the exposed patterned photoresist, etching the copper layer of the copper clad liquid crystal polymer substrate, defined by the patterned photoresist, to expose the liquid crystal polymer layer of the substrate, removing the patterned photoresist from the substrate and etching the exposed liquid crystal polymer layer of the substrate to a predetermined depth, thereby forming a patterned microchannel network in the substrate. In an additional embodiment, the copper layer may be removed from the substrate and the liquid crystal polymer layer may be catalyzed and electroplated.

In a particular embodiment, the patterned microchannel may be electroplated with electroless copper or electroless nickel.

While various etchant solutions and concentrations are within the scope of the present invention, in a particular embodiment, the etchant used is an alkaline etch having a concentration of about 200%.

While various process parameters are within the scope of the present invention, in a particular embodiment, the etching of the exposed liquid crystal polymer layer in conducted at a temperature of about 145 C.

Accordingly, the present invention discloses a process for the fabrication of a microchannel network in a liquid crystal polymer substrate fabricated in accordance with the method steps presented.

The present invention is related to a process for the creation of mask-based, or preferably mask free structures, on planar and curved surfaces which is useful when applied to a variety of materials, including metals, ceramics, organic polymers and semiconductors. These structures are particularly suited for use in mechanical, optical, fluidic and electronic components, and combinations thereof, that form the basis of integrated microfluidic systems, microanalytical systems, micro-total analysis systems and microreaders. In addition, the process can be applied to create fluidic channels having structures integrated within the channel geometry. Thus, this technology has widespread applications in the MEMS, bioMEMs, microcoding technologies, sensor, actuator, and Microsystems markets.

It also follows that an extension of this technology is the application of the direct printer to rapid prototyping of microchannels and minichannels for fuel cells, microrefrigerators, heat exchangers and biomedical devices.

The method in accordance with the present invention will enable the manufacture of lab on chips, microinstruments, integrated fluidic and electronic devices, and integrated optical waveguides.

In contrast to the other methods as known in the art, direct patterning of channels in different photoreactive materials using electronic masks presents a new opportunity to quickly create a wide variety of electrical and photonic circuits, mechanical acoustic waveguides, RF waveguides, and gas or liquid flow channels. When such a patterning technique is combined with post pattern transfer processes, such as chemical etching of the dielectric and post electroformation of metallic layers or thin films, the process of the present invention can be applied to a variety of polymers, and in a particular embodiment, liquid crystal polymer (LCP).

The method of the present invention utilizing electronic imaging, etching and metallization can be combined with CAD design tools, known in the art, to permit manual and automatic generation of 2-D and 3-D prototypes directly from computer design. The present invention allows for further application for the creation of patterned, structured layers for controlling chemical, biochemical and physical properties of surfaces.

The present invention provides many advantages over the prior art, including the ability to create channels and conduits in 3-D dimensions, not limited to 1-D surface features or 2-D voids, vias or thru-holes.

The present invention provides horizontal networks of conduits, thereby establishing a path for fluid flow in 3-D. The deep etch capabilities of the method of the present invention allows the formation of these networks.

An additional advantage of the method of the present invention also allows for the simultaneous combination of electrical structures and functions within or in proximity to the fluid channels, thereby creating fluidics alone, fluidics with electronics, embedded optical waveguides for photonics and combinations of any of the aforementioned structures.

DETAILED DESCRIPTION OF THE INVENTION

Figure 1:
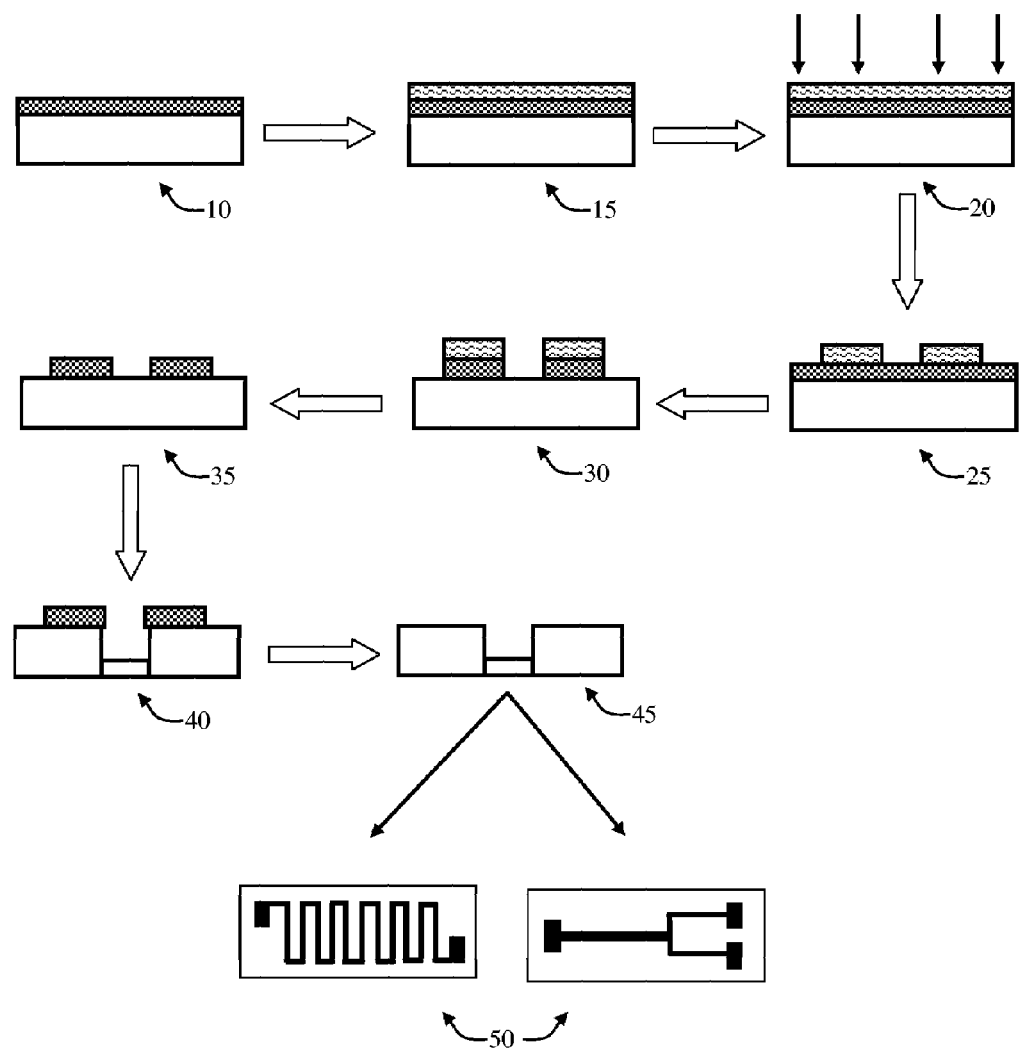
FIG. 1 is an illustration of the process for microchannel fabrication using liquid crystal polymer in accordance with the present invention.

The method in accordance with the present invention is outlined as shown with reference to FIG. 1. The illustrated process of FIG. 1 demonstrates the process flow for the preparation of a microfluidic device utilizing a liquid crystal polymer (LCP)/copper laminate as the starting material in accordance with the present invention.

With reference to FIG. 1, in an exemplary embodiment the method of the present invention includes the steps of applying a copper layer to a liquid crystal polymer layer to form a copper clad liquid crystal polymer substrate 10, applying a patterned photoresist to the copper clad liquid crystal polymer substrate 15, wherein the patterned photoresist defines a desired microchannel network, exposing the patterned photoresist to a light source 20, developing the exposed patterned photoresist 25, etching the copper layer of the copper clad liquid crystal polymer substrate to expose the liquid crystal polymer layer of the substrate 30, removing the patterned photoresist from the substrate 35, etching the exposed liquid crystal polymer layer of the substrate to a predetermined depth 40, thereby forming a patterned microchannel network in the substrate and removing the copper layer from the substrate 45. This process results in a variety of configurations of etched mass transport channels fabricated in LCP material 50.

The method steps outlined above and as shown with reference to FIG. 1 are exemplary in nature. The ordering of the steps presented may be altered and additional steps removed or steps deleted without departing from the present invention.

In an additional embodiment, the channels exhibit a small ratio of surface roughness of the sidewall/channel dimension width to height thereby permitting efficient fluid flow and transfer.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method of forming a patterned microchannel network in a liquid crystal polymer substrate, the method comprising the steps of:

applying a copper layer to a liquid crystal polymer layer to form a copper clad liquid crystal polymer substrate;

applying a patterned photoresist to the copper clad liquid crystal polymer substrate, the patterned photoresist defining a desired microchannel network;

exposing the patterned photoresist to a light source;

developing the exposed patterned photoresist;

etching away the copper layer of the copper clad liquid crystal polymer substrate, defined by the developed patterned photoresist, to expose the liquid crystal polymer layer of the substrate, wherein the exposed liquid crystal polymer layer defines the desired microchannel network;

removing the patterned photoresist from the substrate; and etching into the exposed liquid crystal polymer layer of the substrate to a predetermined depth, whereby the etching results in at least a portion of the liquid crystal polymer layer remaining, thereby forming a patterned microchannel network in the substrate.

2. The method of claim 1, further comprising the step of removing the copper layer from the substrate after the step of etching the exposed liquid crystal polymer layer.

3. The method of claim 1, further comprising the step of catalyzing the liquid crystal polymer layer of the substrate after the step of etching the exposed liquid crystal polymer layer.

4. The method of claim 1, further comprising the step of electroplating the patterned microchannel formed in the substrate after the step of etching the exposed liquid crystal polymer layer.

5. The method of claim 4, wherein the step of electroplating the patterned microchannel further comprises electroplating the patterned microchannel with electroless copper.

6. The method of claim 4, wherein the step of electroplating the patterned microchannel further comprises electroplating the patterned microchannel with electroless nickel.

7. The method of claim 1, wherein the step of etching the exposed liquid crystal polymer layer of the substrate to a predetermined depth further comprises, etching the exposed liquid crystal polymer layer with an alkaline etch having a concentration of about 200%.

8. The method of claim 1, wherein the step of etching the exposed liquid crystal polymer layer of the substrate to a predetermine depth further comprises, etching the exposed liquid crystal layer at a temperature of about 145 C.

9. The method of claim 1, further comprising the step of substantially simultaneously fabricating electrical structures within the patterned microchannel substrate.

10. The method of claim 1, wherein the microchannel network is a fluidic microchannel network.

11. The method of claim 1, wherein the microchannel network is an optical waveguide microchannel network.

12. The method of claim 1, wherein the microchannel network is effective in the transport of fluids.

13. The method of claim 1, wherein the microchannel network is effective in the transport of mass.

14. The method of claim 1, wherein the microchannel network is effective for material containment.

* * * * *